United States Patent [19]

Liu et al.

[11] Patent Number: 5,081,415
[45] Date of Patent: Jan. 14, 1992

[54] LOAD BOARD INSERTION SYSTEM

[75] Inventors: Sung Pin Liu; Shun Jen Sung; Hsin Li Young, all of Hsinchu, Taiwan

[73] Assignee: United Microelectronics Corporation, Hsinchu, Taiwan

[21] Appl. No.: 563,618

[22] Filed: Aug. 7, 1990

[51] Int. Cl.$^5$ ............................................. G01R 1/02
[52] U.S. Cl. .............................. 324/158 F; 324/72.5; 324/158 P
[58] Field of Search ............... 324/72.5, 158 P, 158 F, 324/158 R

[56] References Cited

U.S. PATENT DOCUMENTS

| | | | |
|---|---|---|---|
| 3,866,119 | 2/1975 | Ardezzone et al. | 324/158 F |
| 4,101,824 | 7/1978 | Breedlove et al. | 324/158 F |
| 4,498,047 | 2/1985 | Hexamer et al. | 324/158 F |
| 4,714,879 | 12/1987 | Krause | 324/158 F |
| 4,967,147 | 10/1990 | Woods, Jr. et al. | 324/158 F |

Primary Examiner—Kenneth A. Wieder
Assistant Examiner—William J. Burns
Attorney, Agent, or Firm—Cushman, Darby & Cushman

[57] ABSTRACT

In an improved load board insertion system, a load board adapter ring is to seat a load board to a test head by turning a handle on the load board adapter ring; the load board has guide pins to align a pogo pin stand which is attached to the test head and the load board; the position ring has slanted roller slots which create downward pressure when the rollers on the load board adapter are forced up the slanted roller slots through load board adapter rotation.

1 Claim, 3 Drawing Sheets

LOAD BOARD INSERTION SYSTEM

BACKGROUND OF THE INVENTION

This invention relates to an improved load board insertion system. The prior art load board insertion system (used for Final Test and Circuit Probing Test, abbreviated by F/T and C/P tests) operates mainly to precisely line up the four guide pins on the test head, press the thirty PE adapters on the square load board into the thirty PE cards within the test head, fix the four guide pins, and then press the 42-pin connector making it engage with the connector pins on the load board; in fact, to make the socket of the 42-pin connector completely engage with the connector pins needs a lot of labor and time.

In addition, on each PE card, there are thirty PE adapters on the load board which rely on the four guide pins on the load board to connect with the thirty pads (in 60 sets) for which the precise positions are unknown. In this manner, not only the line-up is difficult, but also a certain amount of labor as well as some luck is needed to smoothly insert the PE adapters into the PE cards. In addition to the installation of the load board, two 42-pin connectors need to be inserted into the load board and insertion of these connectors relies mainly on pushing by hand; if the pushing force is not big enough, it will not be able to insert the connectors completely; but if the force is too heavy, aside from the attrition to the connectors, the line-up of the PE cards and the PE adapters is very easily displaced, resulting in another poor contact.

In the known load board insertion system, connections are made by cables and edge connectors; aside from the disadvantages of poor contacts and time consumed the use of cables and right angular edge connectors makes its applications limited.

SUMMARY OF THE INVENTION

This invention has an object to provide an improved load board insertion system, comprising mainly a position ring, a load board adapter, and a test head having a plural of pogo pins; at the side of these pogo pins guide pins are provided to fix the position of the load board and on the inner ring of the load board adapter, three rollers are provided while a handle is available outside the ring; when the rollers fall into the three roller slots on the position ring, cranking the handle will easily fix the load board to its proper position and falling off or displacement of the load board can be avoided.

Another object of this invention is to provide a more precise and effective line-up device. In an embodiment of this invention, to line up only three guide pins will easily line up the one hundred and fifty pogo pins on the pogo pin stand with the one hundred and fifty pads on the load board. The use of pogo pins with the pressure force of three grams each has tremendously reduced the possibility of poor contact due to improper line-up and unequal pressure.

A further object of this invention is to have easy installation and operation as well as to avoid attrition during change of products to be tested while the use of position slots and position marks directly in the insertion system to perform line-up avoids the trouble of frequent removal and change procedures in IC test and saves two to three (2-3) folds of time than that needed for the known system.

DETAILED DESCRIPTION OF THE PRESENT INVENTION

Figure 1:
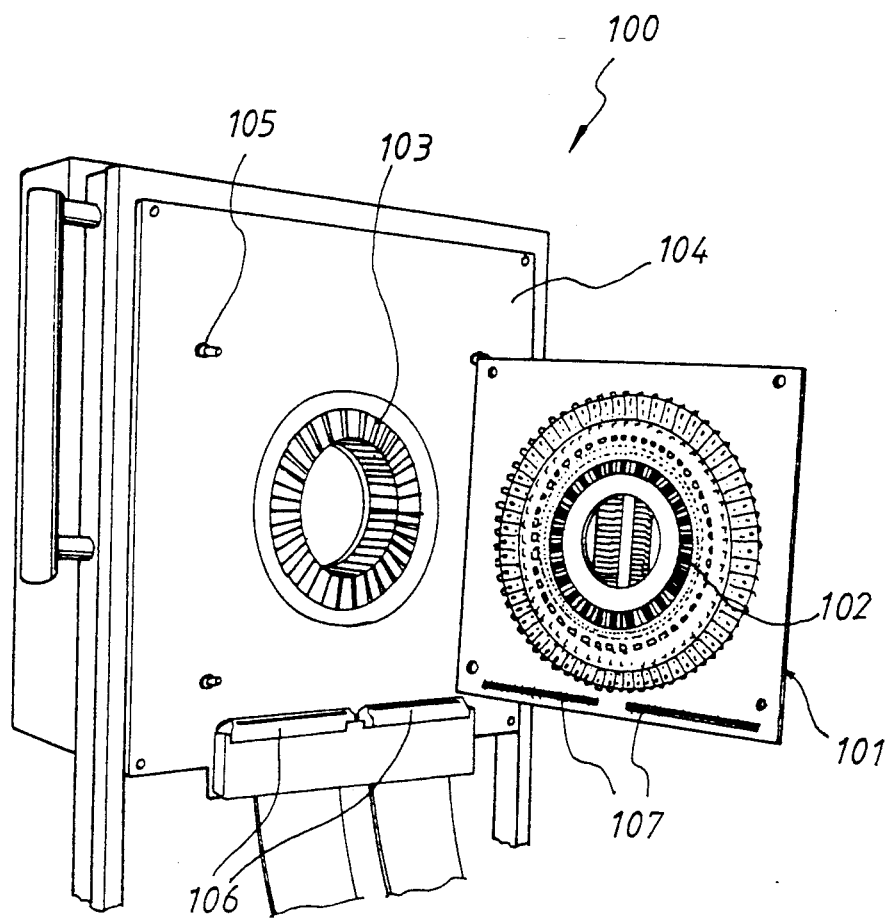
FIG. 1 shows the structure of a known load board insertion system;.

FIG. 1 shows the structure of a known load board insertion system (100), which presses a thirty PE adapter (102) on a square load board (101) into a thirty PE card (103) in the test head, by lining up the four guides pins (105) on a test head (104) and then forcing two 42-pin connectors (106) into connector pins (107) on the load board.

Figure 2:
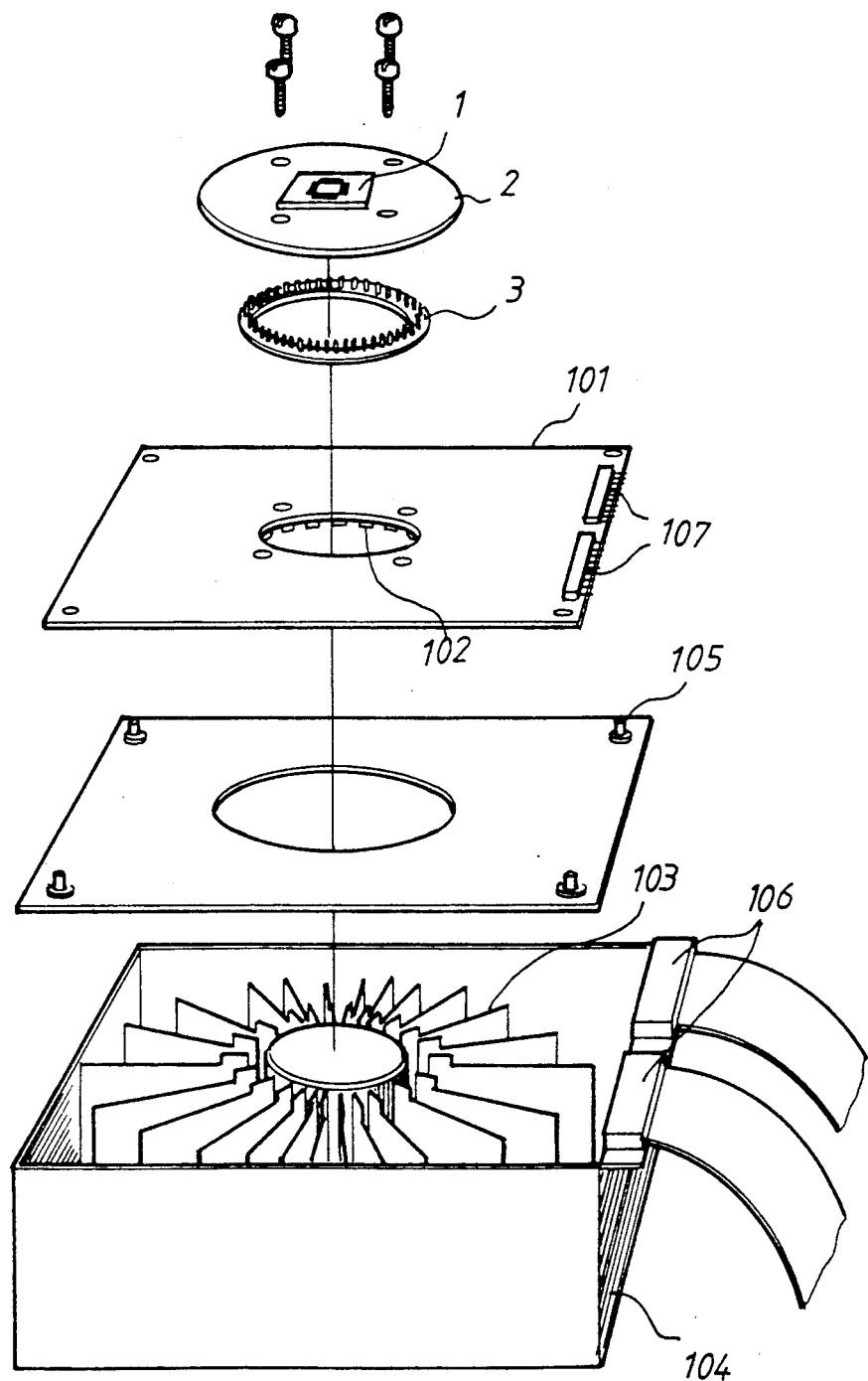
FIG. 2 is an exploded view of the load board insertion system of FIG. 1.

FIG. 2 shows the assembled drawing of the known load board insertion system (100) of FIG. 1, in which, an IC mount (1) is mounted on a DUT board (2), and a contact ring (3) is provided between the DUT board (2) and the square load board (101).

Figure 3:
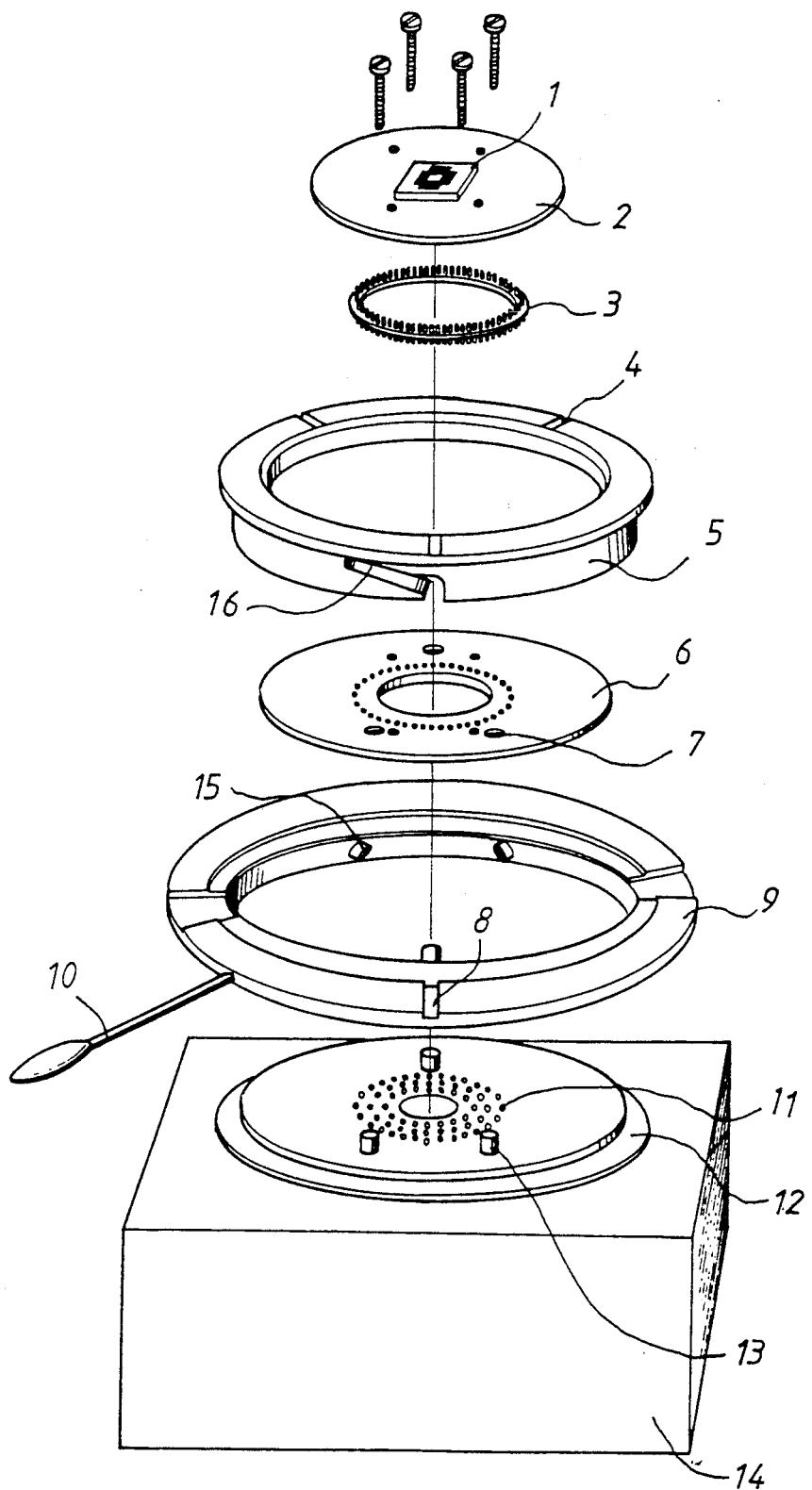
FIG. 3 is an exploded view of the improved load board insertion system in accordance with this invention.

FIG. 3 shows the detailed structure of an embodiment of the improved load board insertion system (200) according to the present invention, which comprises mainly three position slots (4), a position ring (5), three roller slots (16), each having a slope surface and being provided under one corresponding position slot (4), a load board (6), three guide pin slots (7), a load board adapter (9), a handle (10), a plural of pogo pins (11) (150 pins for this embodiment), and three guide pins (13) in addition to the IC mount (1), the DUT board (2), the contact ring (3), etc. of commonly known components. The installation procedure of the load board (6) consists of lining up the three guide pin slots (7) on the load board (6) with the three guide pins on the pogo pin stand (12), placing the load board (6) into the pogo pin stand (12), lining up any one of the three position slots (4) on the position ring (5) with a position mark (8) on the load board adapter (9), placing the position ring (5) into the load board adapter (9), tenderly holding the position ring (5) with the left hand, and cranking with the right hand the handle (10) on the load board adapter (9) from its open position to its locking position.

When C/P test is made in accordance with this invention, four additional guide pins (not shown) may be installed on the load board (6) to line up with the four guide holes (not shown) of the pogo pin stand (on the prober, not shown); therefore, after completion of the load board installation procedure prescribed above, one may directly place a head (14) on the prober, foster the buckle to fix the test head (14), and then load the test program to start performing the C/P test. After the load board installation procedure is completed, the contact ring is installed on the load board, the DUT board (2) for a particular product installed on the board are utilized to connect and fix the load board with the DUT board. Selection of the DUT board depends on the handler (not shown) to be used; the particular line-up method indicated on the DUT board selected for use will be employed to connect the board with the handler, then F/T test can be performed.

Since there are many different kinds, makes, and types of handlers and different ways to line them up, the DUT board to be used also varies. However, as methods of connecting commonly known load boards with DUT boards are all the same, the present invention only explains its ability to make F/T and C/P tests and does not involve the connection with handlers for F/T test.

After reading the above preferred embodiment of the present invention, anyone who is skilled in the art will readily understand how to employ the present invention and become aware of various modifications of said preferred embodiment. The general principle disclosed herein may also be applied to other embodiments and, therefore, the present invention is not limited only to the embodiment described above but covers the widest scope within the various principles and novelty disclosed in this description.

We claim:

1. A load board insertion system for IC C/P and F/T tests, comprising:

a load board having three guide pin slots;

a pogo pin stand provided on a test head, said pogo pin stand having three guide pins to align the guide pin slots of the load board;

a position ring having three position slots, three roller slots, each having a sloped surface and being located under one corresponding position slot; and a load board adapter ring located between the position ring and the pogo pin stand and including a position mark, a handle, and three rollers on the inside of the load board adapter ring, whereby the load board is properly installed on the test head wherein the position ring is placed according to the position mark on the load board adaptor so that the rollers each engage each roller slot under the position slot wherein cranking the handle lines up the guide pin slots with the guide pins.

* * * * *